United States Patent [19]

Cripe

[11] Patent Number: 5,276,357
[45] Date of Patent: Jan. 4, 1994

[54] HIGH EFFICIENCY QUASI-SQUARE WAVE DRIVE CIRCUIT FOR SWITCHING POWER AMPLIFIERS

[75] Inventor: David W. Cripe, Quincy, Ill.

[73] Assignee: Broadcast Electronics, Inc., Quincy, Ill.

[21] Appl. No.: 937,702

[22] Filed: Sep. 1, 1992

[51] Int. Cl.$^5$ .......................... H03K 3/01; H03K 5/12
[52] U.S. Cl. ..................... 307/270; 307/263;
307/268; 307/571; 328/34; 328/35; 328/55;
328/56; 328/59
[58] Field of Search ............... 307/263, 268, 270, 571;
328/34-

[56] References Cited

U.S. PATENT DOCUMENTS

| | | | |
|---|---|---|---|
| 3,868,519 | 2/1975 | Green | 328/35 |
| 4,565,931 | 1/1986 | Fumey | 307/270 |
| 4,705,967 | 11/1987 | Vasile | 307/571 |

OTHER PUBLICATIONS

IBM Tech Disc Bul "Single Input Driver Circuit" Danielski et al., vo. 18 No. 4 9175 pp. 1033-1034.

Primary Examiner—Margaret R. Wambach
Attorney, Agent, or Firm—Hill, Steadman & Simpson

[57] ABSTRACT

A drive circuit generates a quasi-square wave for use in switching power amplifiers by supplying square wave signals which are 180° out of phase, but otherwise identical, to the respective control inputs of two switching transistors. Opposite ends of the respective controlled paths of the transistors are connected to the input of the device which is being driven. The driven device input has a capacitance associated therewith, which normally results in a voltage loss as this capacitance is alternately charged and discharged. The circuit component values are selected so that this capacitance is charged while the switching transistors have yet to reach their threshold voltages, and thus at the moment when either transistor is switched to a conducting state the voltage across that transistors controlled path will be substantially zero, and the normal switching loss, which is a product of the square of that voltage, the input capacitance of the driven device, and the operating frequency, is eliminated.

3 Claims, 1 Drawing Sheet

HIGH EFFICIENCY QUASI-SQUARE WAVE DRIVE CIRCUIT FOR SWITCHING POWER AMPLIFIERS

BACKGROUND OF THE INVENTION

1. Field of the Invention

The present invention relates to drive circuitry of the type of used for switching power amplifiers, and in particular to drive circuitry capable of delivering, to a capacitive load, a voltage substantially in the form of a square wave (quasi-square wave) at high frequency and high efficiency.

2. Description of the Prior Art

In recent years not only has the number of different versions of MOSFET devices and MOS-controlled devices increased, but also the applications of such devices have increased. Examples of such devices are insulated-gate bipolar transistors and MOS-controlled thyristors. Each of these devices has the potential of operating at higher frequencies than earlier technology, and each is a voltage-controlled device. The control input of such devices usually has a capacitance associated therewith, and thus appears as a capacitive load to the drive circuit. The control input, for example, may be the gate of an MOS transistor.

For the most efficient operation of these devices as switches, a voltage square wave must be supplied to this input. This means that the drive circuit must deliver pulses of current to alternatingly charge and discharge the capacitance. Prior art drive circuitry of this type have made use of a so-called totem pole, push-pull arrangement to deliver these current pulses.

A drive circuit of this type exhibits losses equal to $F \cdot C \cdot V^2$, wherein F is the operating frequency of the drive circuit, C is the capacitance of the driven device (i.e., the capacitance "seen" by the drive circuit), and V is the peak-to-peak voltage applied to the input of the driven device. At higher operating frequencies, or in applications wherein a number of driven devices are connected in parallel, these losses in the drive circuit can become appreciable.

SUMMARY OF THE INVENTION

It is an object of the present invention to provide an improved drive circuit for driven devices which appear as a capacitive load to the drive circuit.

It is a further object of the present invention to provide such a drive circuit for MOS-gated power devices.

Another object of the present invention is to provide a circuit capable of applying a voltage in the form of a quasi-square wave to the input of such devices.

It is a further object of the present invention to provide a drive circuit which eliminates the $F \cdot C \cdot V^2$ losses associated with conventional drive circuits, and thus to permit operation at higher frequencies and at a higher efficiency than has been achievable with conventional drive circuits.

The above objects are achieved in accordance with the principles of the present invention in a drive circuit which includes two switching transistors having respective control inputs (gates) which are supplied with input signals that are 180° out of phase, but are otherwise substantially identical. Each of these switching transistors has a voltage threshold which must be reached before the transistor will be switched to a conducting state. Each transistor respectively contributes to the drive of the driven device for one-half of a complete cycle. The circuit constructed in accordance with the principles of the present invention includes a combination of components which, for each half-cycle, cause the input capacitance of the driven device to be charged during a time when the voltage at the control input of the switching transistor responsible for that half-cycle is increasing, but has not yet reached the threshold voltage. The driven device input capacitance is thus charged during a time when that switching transistor is not conducting. Because at the end of that interval the voltage across the controlled path (drain-source path) is substantially zero, the $F \cdot C \cdot V^2$ switching loss exhibited by conventional drive circuits is eliminated when the switching transistor begins to conduct.

The drive circuit is supplied with a square wave input, and delivers a quasi-square wave input to the driven device. As used herein, the term "quasi-square wave" means a signal having a waveform which closely resembles, but may deviate from, a precise square wave, with the deviations being such that the ability to drive a device which is conventionally driven with a true square wave is not impaired.

In one embodiment of the invention, the out-of-phase input signals which are respectively supplied to the inputs of the two switching transistors are obtained by supplying a true square wave to the primary winding of a transformer having two secondary windings, the secondary windings having the same number of turns, but having respective output terminal pairs of opposite polarity.

DESCRIPTION OF THE PREFERRED EMBODIMENTS

Figure 1:
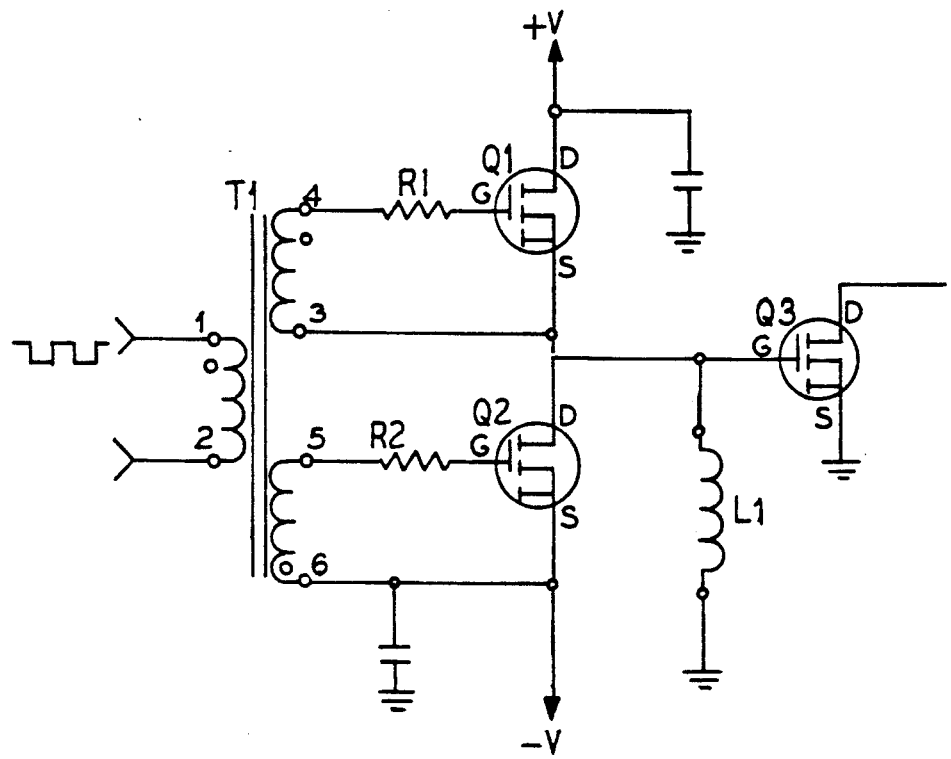
FIG. 1 is a schematic circuit diagram of an exemplary embodiment of a drive circuit constructed in accordance with the principles of the present invention.

An example of a drive circuit constructed in accordance with the principles of the present invention is shown in FIG. 1. A low-amplitude square wave drive signal is supplied as an input signal to the primary of a transformer T1. The transformer has two secondaries. One terminal of one of these secondaries is connected to the source of a switching transistor Q1, with the other terminal of this secondary being connected to the gate (control input) of the transistor Q1 through a resistor R1. One terminal of the other secondary is connected to the source of a further switching transistor Q2, with the other terminal of this secondary being connected to the gate of the transistor Q2 through a resistor R2. The resistances of R1 and R2 are equal. The respective terminals of the transformer T1 are numbered in FIG. 1, with conventional polarity designations. The two secondaries have equal turns, but are of opposite polarity, so that the respective signals supplied to the gates Q1 and Q2 are 180° out of phase, but are otherwise substantially identical.

The drain of the transistor Q1 is connected to a source of positive voltage +V. The source of the transistor Q2 is connected to a source of negative voltage −V. The source of transistor of Q1 and the drain of Q2 are both connected to the input of a device to be driven, which in the embodiment of FIG. 1 is shown to be the gate of a further transistor Q3. The gate of transistor Q3 is shunted to ground via an inductor L1. The transistor Q3 may be a part of a separate switching circuit, the remainder of which is not shown in FIG. 1, whose operation is not relevant to the explanation of the present invention. The input of the driven device has a capacitance associated therewith, in this case the gate capacitance of transistor Q3.

In operation, the drive signal supplied to the primary of transformer T1 must be of sufficient amplitude so that the voltages supplied to the gates of switching transistors Q1 and Q2 are of an amplitude to cause those switching transistors to behave as switches. For most MOSFET devices, a peak voltage in the range of 10 to 20 volts is sufficient. It is also necessary that this drive signal be a square wave. Such a drive waveform will cause transistors Q1 and Q2 to alternately be switched to a conducting state. During the time that the switching transistor Q1 is conducting, the gate voltage of transistor Q3 is held at $+V$, and during the time that switching transistor Q2 is conducting, the gate voltage of transistor Q3 is held at $-V$. As this voltage is applied to the inductor L1, it has an associated current in the form a triangular sawtooth waveform. The resistors R1 and R2, in combination with the gate-source capacitances of switching transistors Q1 and Q2, form respective low-pass networks which control the voltage slew rate appearing at the respective gates of transistors Q1 and Q2. Because transistors Q1 and Q2, being n-channel MOSFETs, each have a switching threshold voltage on the order of three volts, periods exist twice per drive cycle during which neither transistor Q1 nor transistor Q2 is in a conducting state. During these periods, the current from inductor L1 is diverted into the gate of transistor Q3 in a pulsed waveform, thereby rapidly charging the gate capacitance of Q3. By properly selecting the resistance value for R1 and R2, and the inductance value for L1, the peak current in the inductor L1 will passively charge the gate capacitance of the transistor Q3 from $-V$ to $+V$ during a dead-time in which neither transistor Q1 nor transistor Q2 is in a conducting state the value of L1 is chosen in conjunction with the gate capacitance of Q3 to provide a specific transition time which is equal to this "dead-time" of Q1 and Q2. Thus the inductor L1 provides all the energy to charge the gate capacitance of Q3, and Q1 and Q2 serve only to "recharge" the inductor L1 between transitions. The transition consists of the rise (or fall) of the sinusoid have a peak amplitude in excess of the total transition voltage and also having a natural frequency set by L1 and the gate capacitances of Q3. The transition ends when Q1 or Q2 turns on. As can be seen from the L1 equation below, a reduction in the value of L1 results in an increase in the natural frequency F. This has the adverse effect of creating greater conduction losses in Q1 and Q2 according to the $F \cdot C \cdot V^2$ equation. At the end of this time interval when either transistor Q1 or transistor Q2 is switched "on", their respective drain-source (controlled path) voltages are substantially zero. Thus, the $F \cdot C \cdot V^2$ switching loss is eliminated fulfilling an object of the present invention.

Figure 2:
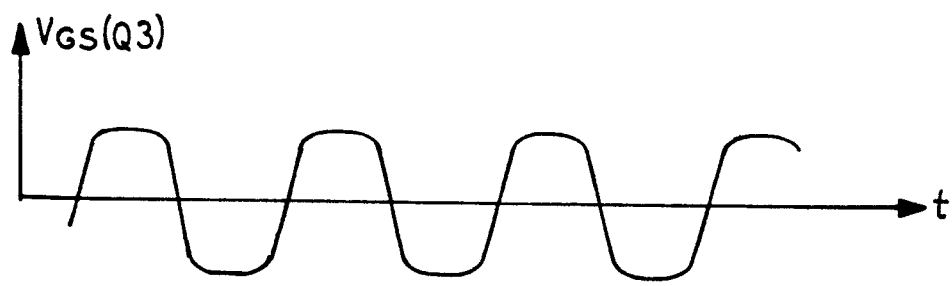
FIG. 2 is a voltage-time diagram showing the shape of an output signal, supplied to a driven device, obtained with the circuit of FIG. 1.

The drive circuit shown in FIG. 1, operating as described above, delivers a quasi-square wave output to the driven device, i.e., to the gate of the transistor Q3, as shown in FIG. 2. In general, the waveform can be described as a sinusoidal waveform having flattened peaks, i.e. somewhat trapezordal, with the sinusoidal portions of the waveform not deviating from a true square wave shape to an extent which impairs the ability of the drive circuit of FIG. 1 to operate conventional devices requiring a square wave input.

The component values for the circuit shown in FIG. 1 are determined by the following equations:

$$R1 = \frac{V_d \cdot C_{gsQ1} \cdot \delta t}{2 V_{gs(th)}},$$

$$R2 = R1 \text{ and}$$

$$L1 = \frac{C_{gsQ3} \cdot \delta t}{8F},$$

wherein $V_{gs(th)}$ is the threshold voltage of the transistor Q1, $V_d$ is the peak amplitude of the drive voltage at the gate of transistor Q1, $C_{gsQ1}$ is the gate-source capacitance of transistor Q1, $C_{gsQ3}$ is the gate-source capacitance of the transistor Q3, and $\delta t$ is the time during which the gate voltage of the transistor Q3 is charged from $-V$ to $+V$. The above equations are valid for the conditions $V_d > 2 V_{gs(th)}$.

Although modifications and changes may be suggested by those skilled in the art, it is the intention of the inventor to embody within the patent warranted hereon all changes and modifications as reasonably and properly come within the scope of his contribution to the art.

I claim as my invention:

1. A drive circuit for supplying a quasi-square wave to a capacitive load, said drive circuit comprising:
   first and second switching transistors each having a control input, a controlled path, and a switching threshold;
   means for supplying respective square wave control signals to said control inputs of said first and second switching transistors which are 180° out of phase but otherwise substantially identical;
   said controlled paths of said first and second switching transistor being respectively connected to voltages of opposite polarity, and to said capacitive load, and operating in combination as a means for respectively alternately holding said capacitive load at said voltages while the switching transistors are alternately rendered conductive by said square wave control signals; and
   means for charging the capacitance of said capacitive load during a time when the square wave control signal at each control input of each switching transistor deviates from zero but has not yet reached said switching threshold so that neither said switching transistor is conducting, wherein said means for charging the capacitance of said capacitive load comprises first and second resistors respectively connected between said means for supplying respective square wave control signals and said control inputs of said first and second switching transistors, and an inductance connected between a junction of said controlled paths of said switching transistors and said capacitive load, and ground.

2. A drive circuit for supplying a quasi-square wave to a capacitive load, said drive circuit comprising:
   first and second MOSFETs each having a switching threshold, a gate, a drain and a source;
   a first resistor connected to the gate of said first MOSFET and a second resistor connected to the gate of said second MOSFET;

said drain of said first MOSFET being connected to a source of positive voltage and said source of said second MOSFET being connected to a source of negative voltage, and said source of said first MOSFET and said drain of said second MOSFET being connected at a junction to which an input of said capacitive load is also connected;

a transformer having a primary and two secondaries, said secondaries having the same number of turns and opposite polarity, one of said secondaries being connected to said first resistor and to said junction and the other of said secondaries being connected to said second resistor and to said source of said second MOSFET, said secondaries supplying respective square wave control signals to said gates of said first and second MOSFETs which are 180° out of phase but otherwise substantially identical;

the respective source-drain paths of said first and second MOSFETs operating in combination as a means, responsive to said square wave control signals, for respectively alternatingly holding said capacitive load at said voltages while the MOSFETs are alternatingly rendered conductive by said square wave control signal; and an inductance connected between said junction and ground, said inductance operating in combination with said first and second resistors as a means for passively charging the capacitance of said capacitive load during a time when the square wave control signal at the gate of a respective MOSFET deviates from zero but has not yet reached said switching threshold so that neither said MOSFET is conducting.

3. A drive circuit as claimed in claim 2 wherein said square wave control signal has a frequency, and wherein said first and second resistors each have a value equal to the product of the peak amplitude of said square wave control signal at the gate of said first MOSFET, the gate-source capacitance of said first MOSFET and the time during which said input of said capacitive load is charged from said negative voltage to said positive voltage, divided by twice the voltage of said switching threshold of said first MOSFET, and wherein said inductance has a value equal to the product of the gate-source capacitance of said capacitive load and said time during which said input voltage of said capacitive load is charged from said negative voltage to said positive voltage, divided by eight times said frequency.

* * * * *